(12) United States Patent
Fainberg

(10) Patent No.: US 10,970,429 B2
(45) Date of Patent: *Apr. 6, 2021

(54) METHOD AND ALGORITHM FOR SIMULATING THE INFLUENCE OF THERMALLY COUPLED SURFACE RADIATION IN CASTING PROCESSES

(71) Applicant: MAGMA Giessereitechnologie GmbH, Aachen (DE)

(72) Inventor: Jakob Fainberg, Aachen (DE)

(73) Assignee: MAGMA Giessereitechnologie GmbH, Aachen (DE)

(*) Notice: Subject to any disclaimer, the term of this patent is extended or adjusted under 35 U.S.C. 154(b) by 742 days.

This patent is subject to a terminal disclaimer.

(21) Appl. No.: 14/759,139

(22) PCT Filed: Jan. 7, 2014

(86) PCT No.: PCT/EP2014/050176
§ 371 (c)(1),
(2) Date: Nov. 5, 2015

(87) PCT Pub. No.: WO2014/106670
PCT Pub. Date: Jul. 10, 2014

(65) Prior Publication Data
US 2016/0048614 A1 Feb. 18, 2016

(30) Foreign Application Priority Data

Jan. 7, 2013 (EP) .................................... 13000047

(51) Int. Cl.
*G06F 30/20* (2020.01)
*G06T 15/06* (2011.01)
(Continued)

(52) U.S. Cl.
CPC ............ *G06F 30/20* (2020.01); *G06F 9/5061* (2013.01); *G06F 17/10* (2013.01); *G06T 1/20* (2013.01);
(Continued)

(58) Field of Classification Search
CPC .... G06T 15/06; G06T 15/506; G06F 17/5009
See application file for complete search history.

(56) References Cited

U.S. PATENT DOCUMENTS 5,226,113 A * 7/1993 Cline ...................... G06T 17/00
345/419
5,546,515 A * 8/1996 Mochizuki .............. G06T 15/55
345/606
(Continued)

FOREIGN PATENT DOCUMENTS

EP 1 667 069 A1 6/2006

OTHER PUBLICATIONS

Bindick et al ("Fast kd-tree-based hierarchical radiosity for radiative heat transport problems." International Journal for Numerical Methods in Engineering 86.9 (2011): pp. 1082-1100.*
(Continued)

*Primary Examiner* — Akash Saxena
(74) *Attorney, Agent, or Firm* — Ziegler IP Law Group, LLC

(57) ABSTRACT

A method for simulating the influence of thermally coupled surface radiation on a solid body, which solid body has at least one surface capable of being exposed to radiation, by calculating the radiative exchange between grey, diffuse surfaces, characterized in that the surface or surfaces to be exposed to radiation is/are subdivided adaptively, hierarchically into radiation tiles of the same or virtually the same radiation intensity, and the surface temperature resulting from irradiation is achieved by means of a hierarchical view
(Continued)

factor method, which view factor method comprises the evaluation of a solid angle integral using a primary solid angle subdivision, which primary solid angle subdivision comprises a homogeneous view factor discretization, wherein each solid angle subdivision is adaptively and hierarchically discretized into its partial areas by spherical projection and wherein the total of all partial amounts of that solid angle integral can be determined by means of ray tracing.

8 Claims, 16 Drawing Sheets

(51) Int. Cl.
  *G06T 15/55* (2011.01)
  *G06T 15/00* (2011.01)
  *G06T 1/20* (2006.01)
  *G06F 9/50* (2006.01)
  *G06T 3/00* (2006.01)
  *G06T 15/50* (2011.01)
  *G06F 17/10* (2006.01)

(52) U.S. Cl.
  CPC .............. *G06T 3/005* (2013.01); *G06T 15/06* (2013.01); *G06T 15/506* (2013.01); *G06T 15/55* (2013.01); *G06T 15/005* (2013.01); *G06T 2210/52* (2013.01)

(56) References Cited

U.S. PATENT DOCUMENTS

| | | | | | |
|---|---|---|---|---|---|
| 5,923,331 | A * | 7/1999 | Dusseux | ................. | G06T 15/40 345/421 |
| 6,023,279 | A * | 2/2000 | Sowizral | ................. | G06T 15/06 345/421 |
| 6,556,200 | B1 * | 4/2003 | Pfister | ................. | G06T 15/06 345/426 |
| 7,554,540 | B2 * | 6/2009 | Hayes | ................. | G06T 15/06 345/419 |
| 7,852,336 | B2 * | 12/2010 | Brown | ................. | G06T 15/06 345/426 |
| 7,952,583 | B2 * | 5/2011 | Waechter | ................. | G06T 15/06 345/426 |
| 9,665,970 | B2 * | 5/2017 | Redgrave | ................. | G06T 15/005 |
| 9,741,155 | B2 * | 8/2017 | Park | ................. | G06T 11/40 |
| 10,140,391 | B2 * | 11/2018 | Fainberg | ................. | G06F 30/00 |
| 2003/0043169 | A1 * | 3/2003 | Hunter | ................. | G06T 15/503 345/611 |
| 2003/0227457 | A1 * | 12/2003 | Pharr | ................. | G06T 15/80 345/426 |
| 2004/0100465 | A1 * | 5/2004 | Stowe | ................. | G06T 15/00 345/427 |
| 2004/0163790 | A1 * | 8/2004 | Boswell | ................. | B22C 7/02 164/122.2 |
| 2005/0041031 | A1 * | 2/2005 | Diard | ................. | G06T 15/005 345/505 |
| 2006/0027402 | A1 * | 2/2006 | Crowe | ................. | C23C 4/00 175/374 |
| 2006/0176302 | A1 * | 8/2006 | Hayes | ................. | G06T 15/06 345/426 |
| 2008/0109168 | A1 * | 5/2008 | Koren | ................. | G01V 1/32 702/16 |
| 2009/0128562 | A1 * | 5/2009 | McCombe | ................. | G06T 15/06 345/427 |
| 2009/0167763 | A1 * | 7/2009 | Waechter | ................. | G06T 15/06 345/426 |
| 2009/0256845 | A1 * | 10/2009 | Sevastianov | ................. | G06T 15/06 345/426 |
| 2010/0194751 | A1 * | 8/2010 | Wald | ................. | G06T 15/06 345/426 |
| 2011/0234583 | A1 * | 9/2011 | Bakalash | ................. | G06T 15/06 345/419 |
| 2013/0069943 | A1 * | 3/2013 | Kallio | ................. | G06T 15/005 345/420 |
| 2014/0168238 | A1 * | 6/2014 | Luebke | ................. | G06T 17/005 345/522 |
| 2014/0176574 | A1 * | 6/2014 | Bakalash | ................. | G06F 12/0875 345/505 |
| 2014/0270344 | A1 * | 9/2014 | Krishnamoorthi | ... | G06K 9/6211 382/103 |
| 2014/0375641 | A1 * | 12/2014 | Bakalash | ................. | G06T 15/60 345/426 |
| 2015/0060150 | A1 * | 3/2015 | Da Silva | ................. | G06F 17/5086 175/428 |
| 2015/0091895 | A1 * | 4/2015 | Shin | ................. | G06T 15/06 345/419 |
| 2016/0048614 | A1 * | 2/2016 | Fainberg | ................. | G06F 17/5009 703/2 |
| 2016/0239998 | A1 * | 8/2016 | Lecocq | ................. | G06T 15/55 |
| 2017/0109204 | A1 * | 4/2017 | Feng | ................. | G06F 9/5083 |
| 2017/0154129 | A1 * | 6/2017 | Fainberg | ................. | G06F 17/50 |
| 2017/0161934 | A1 * | 6/2017 | Fainberg | ................. | G06T 15/06 |
| 2018/0238800 | A1 * | 8/2018 | Lecocq | ................. | G06T 15/506 |

OTHER PUBLICATIONS

Spencer ("The hemisphere radiosity method: A tale of two algorithms." Photorealism in Computer graphics. Springer Berlin Heidelberg, 1992. pp. 127-135.).*

Reiner et al ( "Interactive modeling of implicit surfaces using a direct visualization approach with signed distance functions." ) Computers & Graphics 35.3 (2011): pp. 596-603.*

Kadi Bouatouch et al, Parallel Radiosity Using a Shared Virtual Memory, Article • Aug. 1993, Source: CiteSeer, pp. 14 (Year: 1993).*

Akio Doi et al, Acceleration Radiosity Solutions Through the Use of Hemisphere-Base Formfactor Calculation, The Journal of Visualizationand Computer Animation J. Visual. Comput. Animat. 9, pp. 3-15 (1998) (Year: 1998).*

Bindick et al., "Heat Transfer—Mathematical Modelling, Numerical Methods and Information Technology," ISBN 978-953-307-550-1, A. Belmiloudi, Ed., Ch 7, 22 pg, prt'd Feb. 14, 2011.

* cited by examiner

A

B

METHOD AND ALGORITHM FOR SIMULATING THE INFLUENCE OF THERMALLY COUPLED SURFACE RADIATION IN CASTING PROCESSES

CROSS-REFERENCE TO PRIOR APPLICATION

This is the U.S. National Phase Application under 35 U.S.C. § 371 of International Patent Application No. PCT/EP2014/050176 filed Jan. 7, 2014, which claims the benefit of European Patent Application No. 13000047.4 having a priority date Jan. 7, 2013, both of which are incorporated by reference herein. The International Application was published in German on Jul. 10, 2014 as WO2014/106670 A1 under PCT article 21(2).

The invention relates to a method and an associated algorithm for calculating the thermal surface radiation and the use thereof for simulating the influence of thermally coupled surface radiation, particularly with regard to casting processes.

Furthermore, the invention will be described within the framework of further helpful methods and algorithms which are described here as parts of the method and algorithm for calculating the thermal surface radiation and the use thereof for simulating the influence of thermally coupled surface radiation, the applications whereof are not, however, only limited to the methods and algorithms describe herein.

The invention therefore moreover relates to a method for the discretization of a solid angle for use in a simulation or calculation process, in order to achieve savings in terms of computer time and computer memory used.

The invention therefore further relates to a method of ray tracing for use in a simulation or calculation process, in order to achieve acceleration and savings in terms of computer time and computer memory used. In particular, an unconventional method is proposed by means of parallel computing to accelerate a ray tracing calculation alone and combined with anisotropic Chebyshev distance calculations and/or additional acceleration through tile clustering.

BACKGROUND

Many important properties, such as viscosity, electrical conductivity, the specific volume or chemical reactivity of a material or medium are determined by temperature. For example, in the field of melting, purification and/or the forming of solid substances such as metals, glass, ceramics, for example, observing certain temperatures, frequently also in a time-dependent manner, takes on great significance.

The invention relates to a method and an associated algorithm for calculating the thermal surface radiation and the use thereof to simulate the influence of thermally coupled surface radiation, particularly in relation to casting processes.

The invention further relates to a method for simulating the influence of thermally coupled surface radiation by calculating the radiative exchange between grey, diffuse surfaces, characterized in that the surface or surfaces to be radiated is/are subdivided adaptively, hierarchically into radiation tiles of the same or virtually the same radiation intensity and the surface temperature resulting from irradiation is to be calculated by means of ray tracing as the total of all partial amounts of the radiation tiles.

The invention further relates to a method, as mentioned above, wherein the solid angle is adaptively and hierarchically discretized into its partial areas by spherical projection.

The invention further relates to a method as mentioned above, wherein the ray tracing procedure is accelerated.

Furthermore, the invention is described within the framework of further helpful methods and algorithms which are described here as parts of the method and algorithm for calculating the thermal surface radiation and the use thereof for simulating the influence of thermally coupled surface radiation, the uses whereof are not however limited only to the method and algorithm here.

Moreover, the invention relates to a method for simulating the influence of thermally coupled surface radiation on a solid body, which solid body has at least one surface capable of being exposed to radiation, by calculating the radiative exchange between grey, diffuse surfaces, characterized in that the surface or surfaces to be exposed to radiation is/are subdivided adaptively, hierarchically into radiation tiles of the same or virtually the same radiation intensity, and the surface temperature resulting from irradiation is achieved by means of a hierarchical view factor method, which view factor method comprises the evaluation of a solid angle integral using a primary solid angle subdivision, which primary solid angle subdivision comprises a homogeneous view factor discretization, wherein each solid angle subdivision is adaptively and hierarchically discretized into its partial areas by spherical projection and wherein the total of all partial amounts of that solid angle integral can be determined by means of ray tracing.

The invention further relates to a method as indicated above, according to which the ray tracing is accelerated, particularly according to which each ray tracing is accelerated by radiation tile clustering, according to which each ray tracing is accelerated by an anisotropic Chebyshev distance method and/or according to which each ray tracing is accelerated by means of parallel computing.

Moreover, the invention furthermore relates to a computer software product on a computer-readable medium, which provides a software code for carrying out a method as indicated above.

Bindick, Ahrenholz and Krafczyk summarized the state of the art within the technical field of thermally coupled radiation in three dimensions in "*Heat Transfer—Mathematical Modelling, Numerical Methods and Information Technology*", ISBN 978-953-307-550-1, Aziz Belmiloudi Editor, printed 2011 Feb. 14, Chapter 7—"Efficient Simulation of Transient Heat Transfer Problems in Civil Engineering" (see section 7.3 in particular). Their observations are hereby incorporated in their entirety in referring to this work.

EP 1 667 069 A1 describes a method for determining the distribution of the local radiation intensity in a semi-transparent medium by using ray tracing, wherein a significantly quicker method with a simultaneously smaller memory requirement for determining the distribution of the local radiation intensity in a semi-transparent medium exhibiting at least one boundary surface was introduced.

DESCRIPTION OF THE FIGURES

FIG. 12 shows an example of an actual application.

PRINCIPLES

Energy Balance at the Radiant Surface

The surface radiation is taken into account in a thermal model by adapting the equation for the energy balance condition at the radiant surface.

Without radiation this condition alone is expressed by the heat conduction flows:

$$(\lambda_L \vec{\nabla}_L T - \lambda_R \vec{\nabla}_R T)\vec{N} = 0 \quad (1).$$

The variables with the indices L and R in (1) characterize the heat conductivities and temperature gradients correspondingly to the left and right of the surface. The vector $\vec{N}$ is the normal surface vector.

An additional term, the net heat flux density, enters the balance equation (1) through radiation:

$$(\lambda_L \vec{\nabla}_L T - \lambda_R \vec{\nabla}_R T)\vec{N} + q_{net} = 0 \quad (2).$$

The equation (2) must be solved in a thermally coupled model with surface radiation.

The net heat flux is made up of the difference between the absorbed and emitted radiant heat:

$$q_{net} = \epsilon(q_{in} - \sigma T^4) \quad (3).$$

$\epsilon$ in (3) is the emissivity of the surface. In the case of the so-called grey and diffuse radiant surface, it is averaged out hemispherically via the entire electromagnetic spectrum and via the solid angle. It is also assumed in the same way as the absorption coefficients likewise averaged out.

$q_{in}$ in (3) is the incident heat flux density. The problem addressed by a numerical model for surface radiation is that of determining the values of the incident radiation at each part of the radiant surface.

Calculating the Incident Heat Flux

The incident heat flux is coupled by an integral to the outgoing heat flux:

$$q_{in} = \int_{(\vec{\Omega} \vec{N}) > 0} (\vec{\Omega} \vec{N}) q_{out} \partial \Omega \quad (4).$$

Integration takes place via the solid angle $2\pi$. The result applies to the centre of the piece of the radiant surface.

The view factors method replaces the integral in (4) with a total through the contributions of the individual subdivisions of the radiant surface, for which direct visibility exists through linear optics. In a normal case, the faces of the numerical grid act as individual elements of the surface, wherein the clustering of a plurality of adjacent faces of the grid in radiating elements of this kind is also known according to the hierarchical view factor method.

Figure 1:
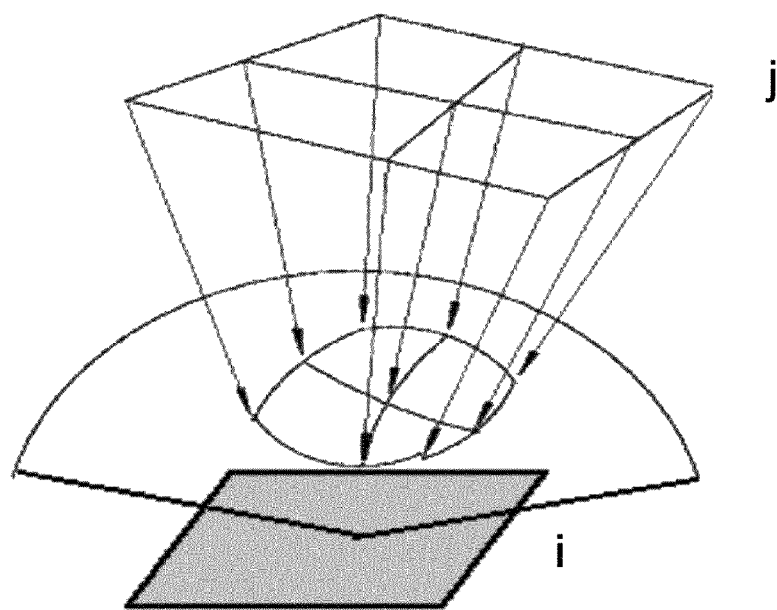
FIG. 1 is an illustration of the solid angle through half a unit sphere.

The solid angle is often depicted by half a unit sphere, as shown in FIG. 1. A unit sphere is placed about the centre of the radiant surface. The surrounding visible radiant surface grid is centrally projected onto the unit sphere. According to the Nusselt principle, the component of the projection onto the unit sphere parallel to the equatorial plane is equal to the view factor in each case.

Calculation of the view factors is illustrated geometrically in FIG. 1. In order to determine the value of a view factor between the surface j outside and the surface i (shaded grey in the image), the visible part of face j should be projected onto the unit sphere about the centre of face i to begin with. The calculation of the total integral (4) involves the projection of the entire radiating grid onto the unit sphere, as is illustrated in FIG. 1).

The complexity of the quadrature (4) is generally proportional (to) the square of the subdivisions of the radiant surface through the numerical grid. The calculation according to (4) can therefore lead to an excessive memory and computational work requirement, particularly for large, complex geometries.

The geometric diagram of the view factors method according to FIG. 1) can be inverted, which may result in principle in a smaller memory requirement and less computational work.

In the case of view factors, the subdivision (discretization) of the solid angle is fixed by the previously generated numerical grid. The refinement of the subdivision completely exists through the numerical grid.

Figure 2:
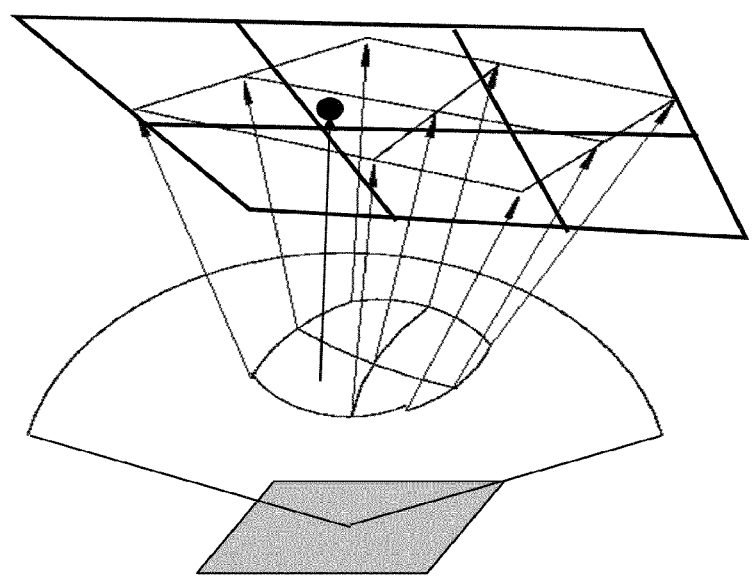
FIG. 2 is an example of the securely embedded discretization of the solid angle.

Conversely, however, it is possible to fix any subdivision of the solid angle initially independently of the numerical grid at the edge of the transparent cavity in the first step. In the second step, this subdivision of the unit sphere is then projected onto the surrounding grid. The principle is explained in FIG. 2.

This diagram leads to another logic in the integration of the heat flux according to equation (4). While the problem addressed by the view factor method involves determining the individual subdivisions of the solid angle, the subdivisions being a map of the visible subdivisions of the surface, the individual subdivisions of the solid angle are fixed in the alternative method and therefore known in advance. The actual problem is now looking for a representative element of the radiating grid which assumes the role of the radiation source for the given piece of the subdivision of the solid angle. It is therefore assumed that the radiation intensity emanating from the located radiation source is homogeneously present in the entire subdivision of the solid angle (see FIG. 2).

The following approach is taken with the securely embedded discretization of the solid angle. In the first step, a particular subdivision of the unit sphere about the centre of the selected radiant face i is undertaken independently of the numerical grid. In the second step, a central projection of this subdivision onto the surrounding grid is carried out. The direction of the projection is illustrated upwards by arrows; cf. the reverse projection direction in the view factors method in FIG. 1. The projection of the centre point of each part of the solid angle is assigned to an element of the radiating grid, so that the entire subdivision of the solid angle is mapped onto the radiant face elements.

An error in the discretization of the distribution of the heat flux over the solid angle occurs if the part of the solid angle being observed, projected onto the radiant grid, has face elements with widely divergent emitted heat flux densities, which leads to a great variation in radiation intensity within the solid angle.

The advantage of this method is that complex geometric analysis of the masking is dispensed with. For each subdivision of the solid angle starting from the centre of the face, a single test ray is sent out. The ray direction corresponds to the centre point of the given part of the solid angle.

The sending out of rays or ray tracing is dealt with in greater detail in the section entitled "Ray tracing".

Radiation Tiles

The method of subdividing the radiant surfaces is illustrated by way of example below by means of the numerical grid currently used in the MAGMAsoft program (MAGMA Gießereitechnologie GmbH). The method can, however, be used in principle for any grid types without restriction.

MAGMAsoft uses a tensor product grid. The 3D grid is made up of three systems of grid lines in 3 Cartesian spatial directions X, Y, and Z, which run through the entire model and embed it in a cuboid. The grid is therefore made up of orthogonal cuboid cells.

The numerical grid therefore consists of an orthogonal grid and is therefore only completely defined by the material distribution over the grid cells in this grid and three rows of coordinates along the three Cartesian directions. The individual radiant surfaces in the radiation model are found in the grid during their initialization by material proximities in the grid. A radiant surface is defined as a right-angled facet of a grid cell with the normal vector in one of the 6 spatial directions +X, −X, +Y, −Y, +Z, −Z, if one of the 2 conditions is satisfied:

1. The facet divides two grid cells, one of which is covered with an opaque material and another with a transparent. The normal vector points in the direction of the transparent cell. The transparent material in MAGMAsoft is normally air, in which case only the heat conduction is calculated.

2. The facet divides two grid cells, one of which is covered with an opaque material and another with the ID boundary material. The cell with the boundary material lies outside the computation area of MAGMAsoft. A facet of this kind is defined as a radiating face if it does not lie at the boundary of the bounding box of the grid, namely because no other facet is visible there viewed from the surface. In this case, the determination of the net heat flux is trivial.

The radiant faces defined in this manner contribute to the energy balance according to equation (2). They are referred to below as radiation tiles or tiles.

Discretization of the Solid Angle

The complete solid angle is subdivided in this method in such a manner that each subdivision corresponds to the same view factor VF, namely $VF_j=1/N=const$, wherein N is the total number of subdivisions. A homogeneous subdivision of the unit sphere of this kind in relation to view factors is not a homogeneous subdivision of its surface on account of the term (SW) in the corresponding integral:

$$\int_{\Omega_i} (\vec{\Omega}\vec{N}) \partial\Omega = \int_\phi \int_\theta \sin(\theta)\cos(\theta) \partial\phi \partial\theta = \frac{\pi}{N} = const. \quad (5)$$

The advantage of a subdivision of this kind emerges when calculating the incident heat flux according to equation (4). The view factor which is constantly the same can be excluded, since determination of the incident flux changes into an averaging of the outgoing flux.

$$q_{in}^j = \frac{1}{N} \sum_{j=1}^{N} q_{out}^j. \quad (6)$$

A homogeneous distribution of the unit sphere according to the view factors is not unambiguous and can take place in innumerable ways. The method chosen here additionally presents a certain symmetry in subdivision in relation to the normal vector of the radiation tile and is easy to handle.

The unit sphere is initially axially symmetrical, starting from a circle at the north pole, subdivided into a series of radially consecutive rings. Each ring is then subdivided into a different number of ring segments in the azimuth direction. Each segment is a spherical rectangle bounded by 2 azimuth and 2 meridional coordinate lines (circular arcs) of the spherical coordinate system. The number of subdivisions in individual rings forms an arithmetical progression (see FIG. 3).

The subdivision can be completely parameterized by the number of rings n in the meridional direction and the number of azimuth segments of the first ring at the north pole r. For each possible parameterization (n, r) there is a single solution for the meridional coordinates of the rings, so that each spherical segment can always be assigned the same view factor:

$$\theta_i = \frac{1}{2}\arccos\left(1 - \frac{(n-i+1)(2r+n+i-2)}{N}\right). \quad (7)$$

N in (7) is the total number of subdivisions according to the arithmetical progression:

$$N = \frac{2r+n-1}{2}n+1. \quad (7a)$$

Figure 4:
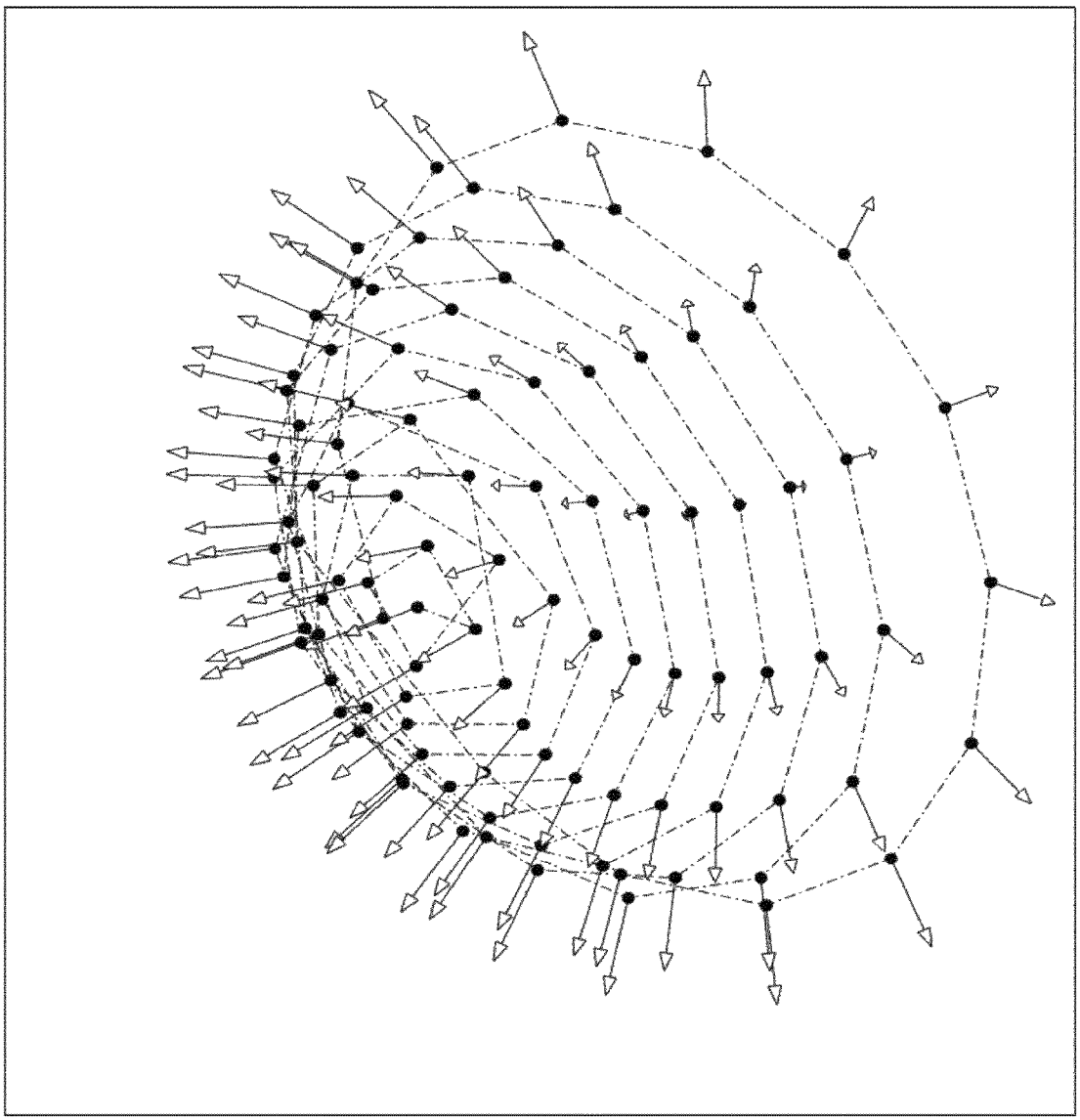
FIG. 4 is an example of the system of direction vectors for parameterization (r=4, n=10) resulting from the equation (7). The total number of directions according to (7a) is equal to N=86.

The number of subdivisions N and therefore also the number of rays per one tile grows quadratically according to (7a) with the number of defined meridional rings n (see FIG. 4).

Figure 3:
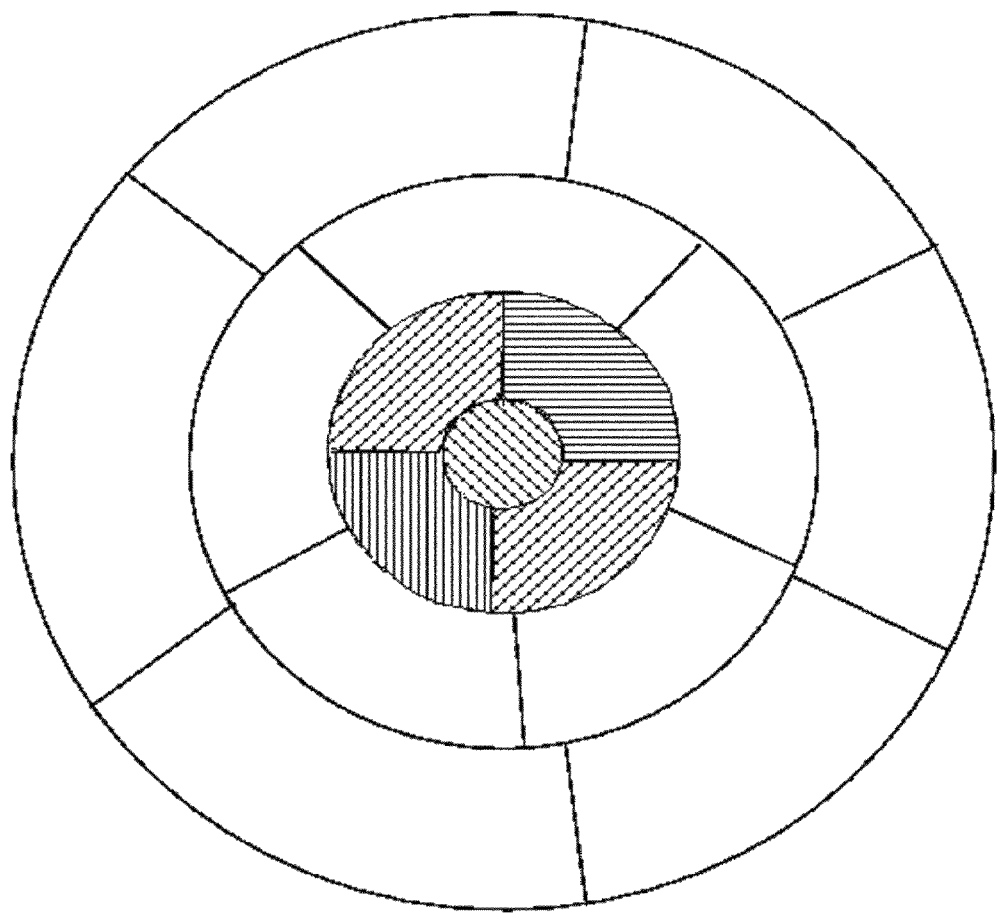
FIG. 3 is an illustration of the chosen principle of the fixed subdivision of the unit sphere, the view "from above" along the normal direction of the radiation tile. The subdivision resembles a target and comprises the azimuthally arranged segments, which in turn form radial rings.

The segments in a ring from FIG. 3 may be turned in the azimuth direction about a free angle, so that a greater angle distance is created between segments of the adjacent rings.

Hierarchical System

An excessively rough subdivision of the unit sphere leads to numerical errors in the integration of the heat flux, as was explained in the section entitled "Energy balance on the radiant surface". In order to achieve a higher angle resolution in relation to the geometry of the radiating grid, work is conducted in this method with a hierarchical system of discretization levels. This method is similar to the various refinement stages of the numerical grid in an explicit multi-grid method.

The first level is represented by the system of spatial directions produced according to the equation (7), see FIG. 4. The next level is produced by subdividing each segment of the first level by doubled halving in the azimuth and meridional direction, in other words by quartering.

The exception exists with the first refinement of the circular region at the north pole, which is divided with 4 azimuth subdivisions into 4 spherical triangles. Where there are further subdivisions, no exception rules apply, all spherical regions are refined as spherical rectangles, as described above. The 4 spherical triangles around the north pole are treated as abnormal spherical rectangles from the third refinement level.

Thereafter the next finer level is further subdivided recursively according to the same principles. This produces a geometric progression of the number of rays at each successive level. For k levels of refinement:

$$N_{tot} = N \frac{4^k - 1}{3} = \left( \frac{2r+n-1}{2}n+1 \right) \frac{4^k - 1}{3}. \quad (7b)$$

Rays result at all levels of refinement.

Figure 5:
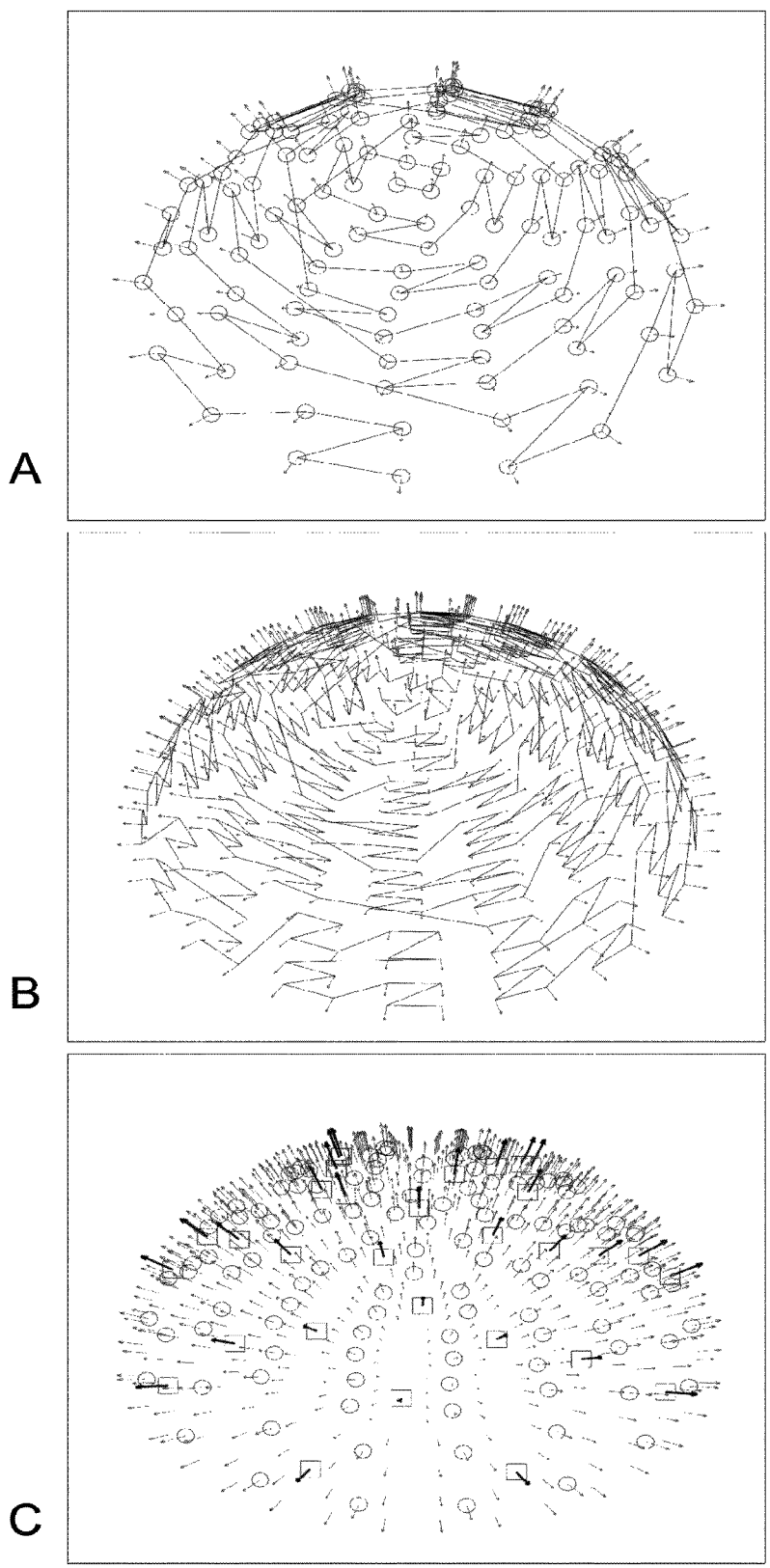
FIG. 5A shows the second refinement level created from the first level with subdivision (r, n)=(4,10), see FIG. 4.
FIG. 5B shows the third level created from the second level, see FIG. 4.
FIG. 5C shows the direction vectors from all three levels. Vectors from different levels are characterized using different symbols at the origin of the vectors, cf. using FIGS. 4, 5A and 5B. The rays for all directions shown in FIG. 5C are sent out according to the ray tracing method.

The directional vectors according to the refinement are shown in FIG. 5. Three refinement levels are used in the current implementation.

In the hierarchical method of ray tracing, rays are initially sent out in succession from all refinement levels and all results thereby obtained are stored. The results are then evaluated.

Adaptation to the Geometry and Temperature Distribution

It would be entirely possible to undertake the hierarchical subdivision of the solid angle described in the preceding section virtually and only send rays for the vectors of the finest level reached. The result would be that all radiation sources located following ray tracing would have to be processed in the thermal model, something that would have resulted in an unnecessarily large amount of computational work in the event of a large number of rays. If, for example, the angle resolution set by the number of rays in one spatial direction is too high, the same radiation source defined by a radiation tile would be encountered multiple times by different rays. The angle resolution from the coarser refinement levels would therefore be adequate at this point.

If, however, the rays are sent by all defined refinement levels, the possibility exists for the angle resolution to be adapted locally. The result of ray tracing for the thermal calculation without adjustment would be a complete list of radiation sources, which all result either from the primary subdivision (FIG. 4) or from one of the refinement levels (FIG. 5).

The local adaptation of the angle discretization replaces a list of this kind with sub-lists from all discretization levels. The approach in this case is as follows.

The subdivisions of all refinement levels are marked beforehand as "not refined". It is initially assumed that the discretization only contains vectors of the most refined level. The subdivisions of the next coarser level are then passed through until the coarsest primary level is reached.

Each time the radiation sources of the preceding finer level are checked, said radiation sources corresponding to the four quarters of the subdivided spherical rectangular of the finer level. The previously defined active radiation sources of the 4 quarters are either replaced by a radiation source from the current spherical segment or retained.

1. If at least one of the 4 subdivisions is already marked as "refined", all radiation sources already defined on the finer levels within the current spherical segment are retained and the source from the current level is rejected.
2. If all 4 rays of the finer level have encountered the same opaque material or all 4 rays have come to nothing, i.e. have left the half-open transparent cavity, the radiation sources of the finer level already defined are rejected and replaced by the radiation source of the current level.
3. If 4 rays both leave the cavity and also encounter an opaque material, the radiation sources already defined from the finer levels are retained.
4. If 4 rays encounter different opaque materials, the temperatures of the radiation tiles encountered are compared with one another. If the hierarchical system of the directions is adapted for the first time during this prior to thermal simulation, temperatures of the sources come from the first temperature initialization for different materials. Otherwise, if the adjustment takes place dynamically during the course of the calculation, these are the currently calculated temperatures. If the absolute difference between the maximum and minimum temperature relative to the maximum temperature is smaller than the fixed defined boundary, the radiation sources of the finer level already defined are likewise rejected and replaced by a source from the current level. Otherwise they are retained.
5. Once a subdivision in the current level is processed, it is marked as either "refined" or "not refined", depending on the outcome. If this results in the replacing of the sources of the finer levels with a source of the current level, this is entered in the list of sources taken into account of the current refinement level. If one of the sources is marked as "not refined", the source is entered in the list of sources taken into account for the finer level. The entry is made only if the new source belongs to a surface of the opaque material. Otherwise, the view factor of the outer unmasked space is increased by a constant value of the current refinement level i equal to $$\frac{1}{N4^{i-1}}.$$

Figure 6:
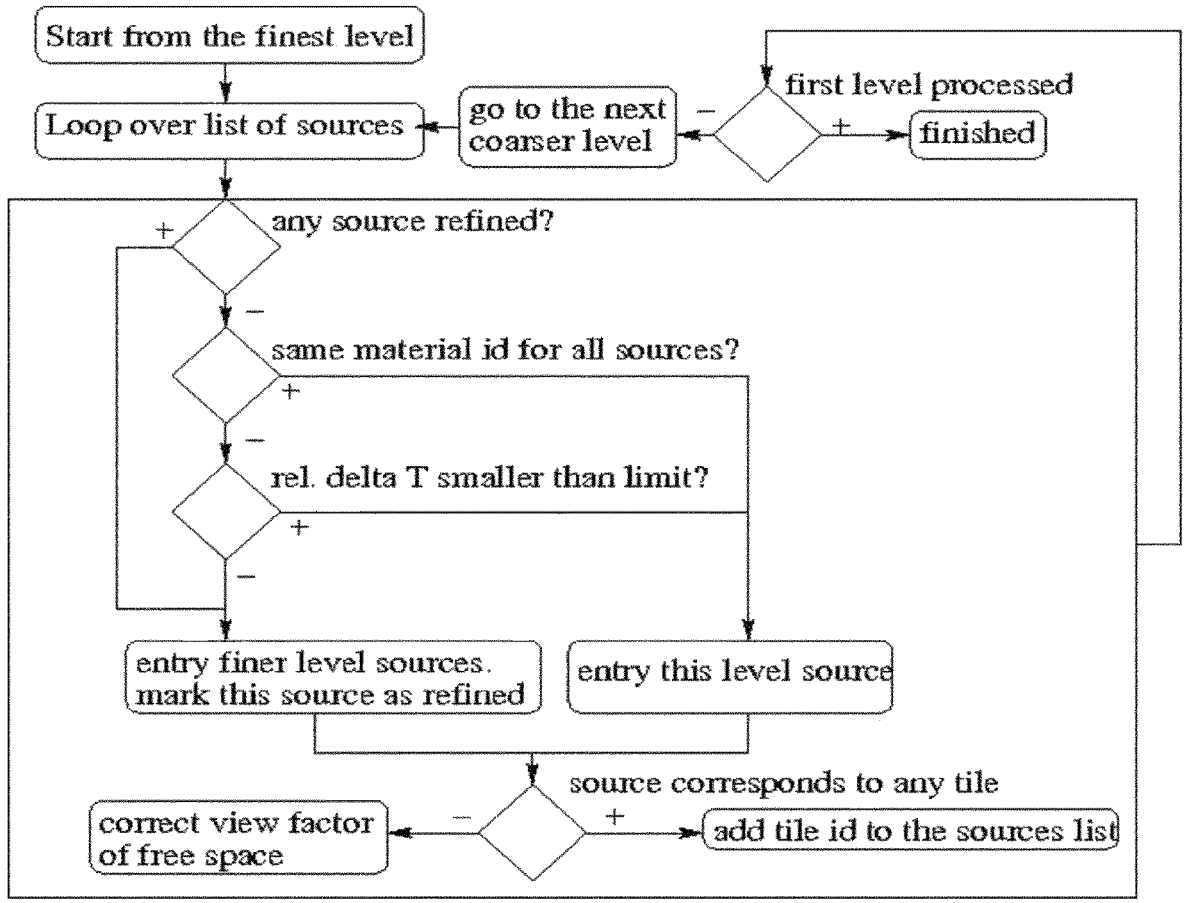
FIG. 6 is the flow chart for selecting radiation sources from different refinement levels of the angle discretization.

The sequence described above is represented in FIG. 6. The algorithm supplies k lists of radiation sources for k levels of homogeneous discretization. The adapted angle discretization in this case is chosen in such a manner that a concentration of representative radiation sources occurs in the angle regions, where an inconsistent dependence of the radiation intensity on the spatial direction can potentially be expected.

The jump in radiation intensity happens in the half-open cavities at a boundary between the hot opaque material and the open space. A jump of this kind is also caused by the thermal contrast between two adjacent opaque materials in the angle space. The materials labelled with different ID's may either be in direct thermal contact along their boundary in the angle space or partially mask one another.

The adapted discretization of the solid angle for the radiation tile observed takes place in this way through the selection of radiation sources. The subdivided surface of the unit sphere may be used to represent the angle discretization. Following adaptation it is completely covered without overlaps by spherical segments from different refinement levels.

Figure 7:
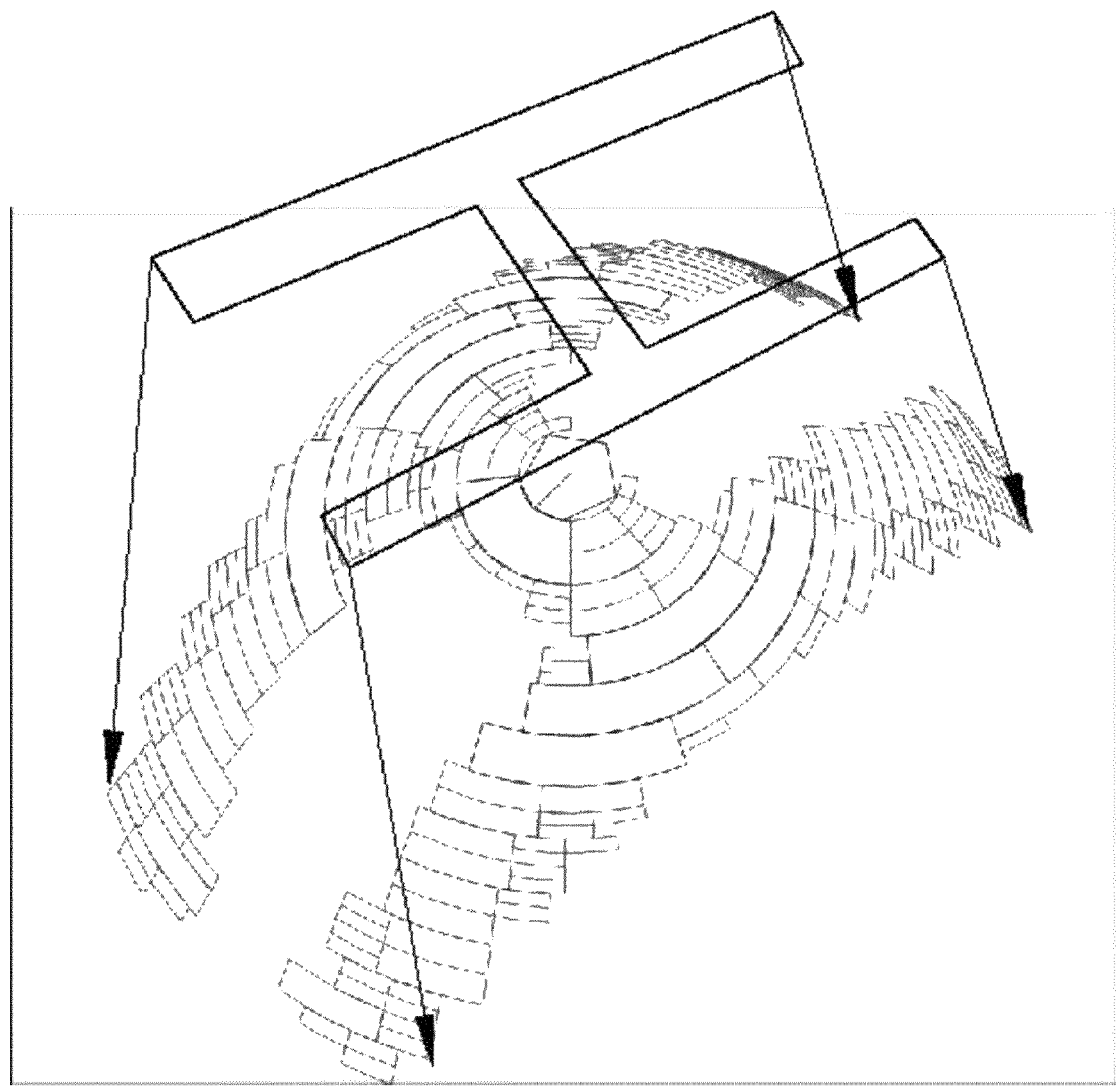
FIG. 7 is an example of the adapted discretization of the solid angle. The spherical rectangles from different levels are marked in the diagram in the refinement direction.

One example of the adapted discretization of the solid angle is shown in FIG. 7. A view factor of an H-shaped face, shown top left in the figure, is to be approximated by ray tracing. For this purpose, 3 discretization levels with the first level parameterized with (n=15,r=4) according to equation (7) were used. The number of rays is equal to 166, 664 and 2656 for the discretization level corresponding to 1-e, 2-e and 3-e, so that a total of 3486 rays are sent out to scan the hemisphere. After the geometric adaptation has been carried out 218 rays have been selected, which is smaller by a factor of 16 than at the finest level. The spherical rectangles from different levels are marked in the figure, sorted in the refinement direction by their size.

The outgoing heat fluxes, defined by sources from different levels, must be weighted differently in the calculation of the incident heat flux. The equation (6) for the incident heat flux is supplemented by pre-exponential factors of different levels:

$$q_{in}^i = \frac{1}{N} \sum_{level=1}^{k} \frac{1}{4^{k-1}} \left( \sum_{j=1}^{N_{level}} q_{out}^j \right). \tag{8}$$

For three levels k=3. Three totals with the weight factors 1, ¼ and ¹⁄₁₆ produce the total incident heat flux according to (8). The terms $q_{out}^j$ in the inner total are amounts from the list of radiation sources of the respective discretization levels.

Ray Tracing

A voxel-based ray tracing method with reverse ray tracing is used.

A voxel supports the test as to whether the ray encounters an object in the given voxel. A voxel is a cube-shaped volume where the information on geometric objects is contained therein. When used with MAGMAsoft, a tensor product grid is provided as a grid consisting of the individual voxels itself. Each grid cell becomes a voxel. The method according to the invention is not however tied to the MAGMAsoft program and can be used for any voxel-based ray tracing method.

Reverse tracing means that all rays are initially sent out from the tile that receives the radiation. The radiation sources encountered by rays are thereby determined. However the radiation sources transmit energy physically to the receiver. The energy reaches the tile on the "straight" path, which corresponds to a reverse direction in the ray path of ray tracing. This is therefore referred to as ray tracing with reverse tracing.

The geometric objects that absorb and reflect the rays are the defined radiation tiles that are defined in the grid cells with the help of the material proximity.

Due to the structured nature of the numerical grid, it is sufficient for 3 tile ID's to be stored per grid cell. If 6 sides of a grid cell are referred to as the front, back, west, east, north, south, the 3 ID's refer to three possible tiles on the back, east and north side of the cell. Information relating to the tile on three remaining sides of the cell top, west and south can be taken from the neighbouring cell. Positive values are allocated to the actually existing tiles on one side of the cell. The allocation takes place during the tile definition.

Before the ray tracing begins, the entire defined bundle of vectors indicating the directions of individual rays is centred about the normal vector of the respective tile. This is achieved through multiplication of the vectors with a rotational matrix which converts the central vector of the bundle in the Cartesian direction +Z into the normal vector of the tile.

The rays are then consecutively sent out from all refinement levels. Ray tracing by the numerical grid involves the search for intersections between the continuation of the ray and the individual sides of the grid cell in which the ray is currently located (see FIG. 8).

For this purpose, three possible sides of the grid cell are checked for the next intersection. The possible sides are given by the sign of the three components of the ray direction $\vec{\Omega}$. The intersection with the minimum distance from the current ray position is treated as the next point on the ray. The side of the cell with the minimum length up to the intersection is searched for during this and the ray continued as far as the located intersection in direction $\vec{\Omega}$ by the located length $\Delta X^{ray}$:

$$X_{MIN} = \text{MIN}_{L=(i,j,k)} \frac{X_l - X_l^{ray}}{\Omega_l}. \tag{9a}$$

$$\Delta X_i^{ray} = X_{MIN} \Omega_i. \tag{9b}$$

Once the next intersection has been found, the ID is requested of the corresponding tile on the side of the grid cell.

If the ID corresponds to an actual tile, i.e. the side of the cell separates an opaque and a transparent material, the ray tracing is stopped and the global ID of the radiation source that has been located returned.

If the ID corresponds to a symmetry plane having a Cartesian normal vector, the directional component normal to the symmetry plane is inverted and the reflected ray traced further.

Otherwise, the ray tracing procedure is repeated in the next grid cell until the ray encounters a tile or leaves the boundaries of the numerical grid. In the latter case, a fixed ID of the outer space is returned.

Acceleration
Ray Tracing
Tile Clustering

The levels of finely networked radiant surfaces (plates) often occur with the modelled geometries. They produce very many radiating elements. The computational work involved in radiation modelling is linearly proportional to the number of radiation tiles using the model presented. Computational time can be saved if the fineness of the networking surpasses the required resolution in the distribution of the integrated heat flux (=irradiance) along the surface. In this case, it would be sufficient to have fewer coarser tiles than embedded by the numerical grid.

In published methods such as, for example, the DTRM model of FLUENT, reference is made to clustering of radiation tiles. Here, a plurality of adjacent radiation tiles is clustered if they deviate from a level by only a minimal angle (planarity). The ray paths and the heat fluxes are not calculated for each component of the cluster, but for the entire clustering at the location of its geometric centre. A similar technique is implemented for "moderate" acceleration in the current method.

All radiation tiles have a Cartesian orientation in the current model. The clustering of neighbours is allowed if they lie on a level and their grid cells also have the same opaque material.

Figure 9:
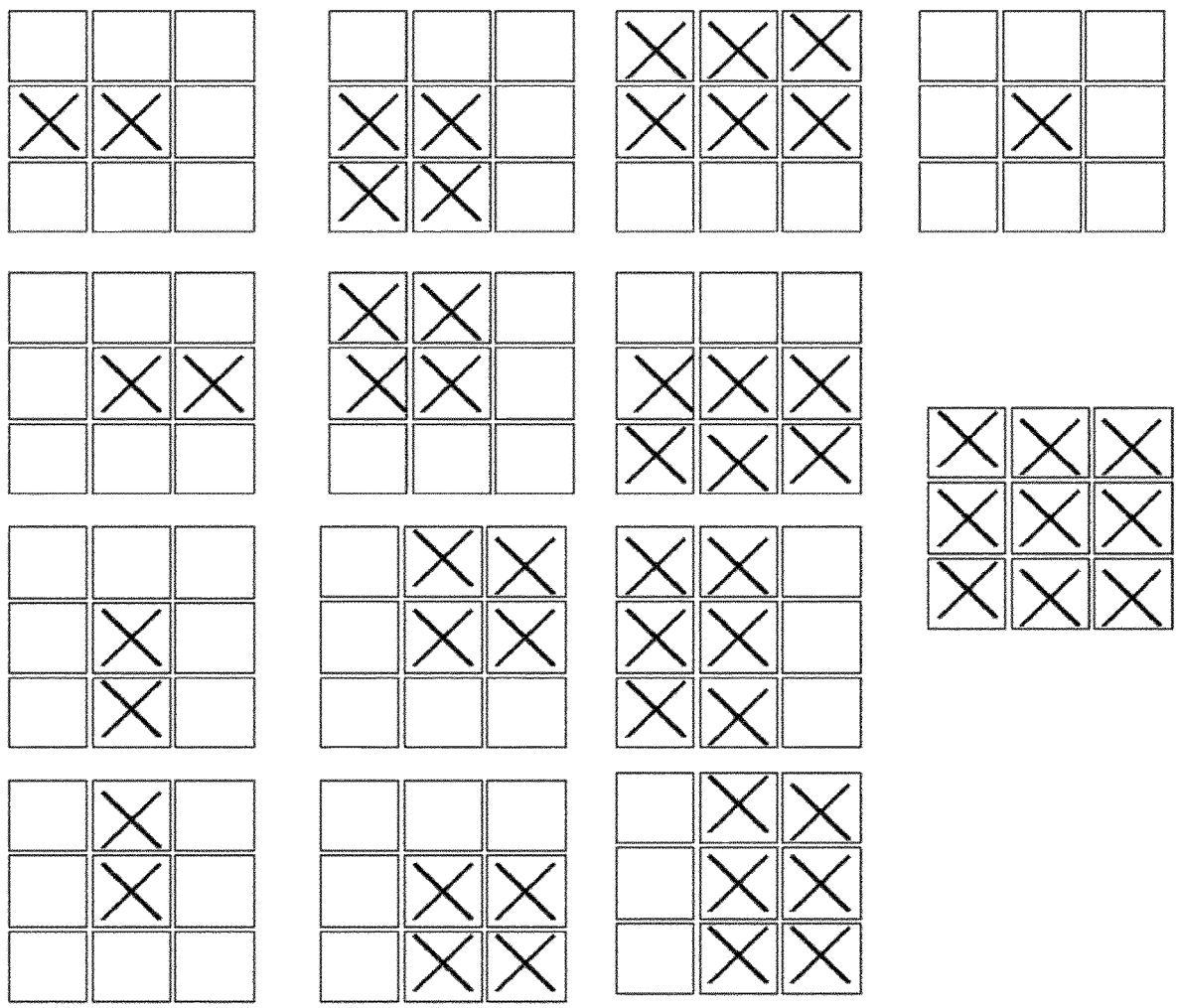
FIG. 9 shows supported variants of the tile structure starting with individual, radiating sides of the orthogonal grid cells (crosses).

Up to 3 clustered tiles are permitted in each of the two lateral directions along the surface. This means that between 1 and up to 9 sides of the grid cells can be clustered into a tile. The permitted variants are shown in FIG. 9.

Clustering of the radiation tiles usually occurs densely only on flat surfaces. In the case of curved geometries, the surface grid is stepped, as a result of which the number of coplanar sides of the grid cells is reduced.

Acceleration by a factor of 2 or slightly more is achieved on average by the implemented tile clustering method in the case of complex geometries. In program terms, the tile clustering in clusters consists of the following steps:

The list of grid cells belonging to a cluster radiation tile is stored in the data structure of a radiation tile.

Ray tracing starts for each cluster from its geometric centre.

Information on the radiation sources located and adapted is likewise stored for the entire cluster rather than for each component, however small.

The emitted heat flux of the cluster is calculated taking account of temperature distribution:

$$q_{em} = \epsilon \frac{\sum_i S_i T_i^4}{\sum_i S_i}. \quad (10)$$

S is the face of side i and T the absolute temperature at the surface of the grid cell.

The calculated incident heat flux is the same for each member of the cluster, which leads to local smearing, smoothing of the heat flux. However this is the price of acceleration.

The mean incident heat flux is included in the energy balance (2) in the same way for each side of the grid cell from the cluster.

Anisotropic Chebyshev Distance

Figure 8:
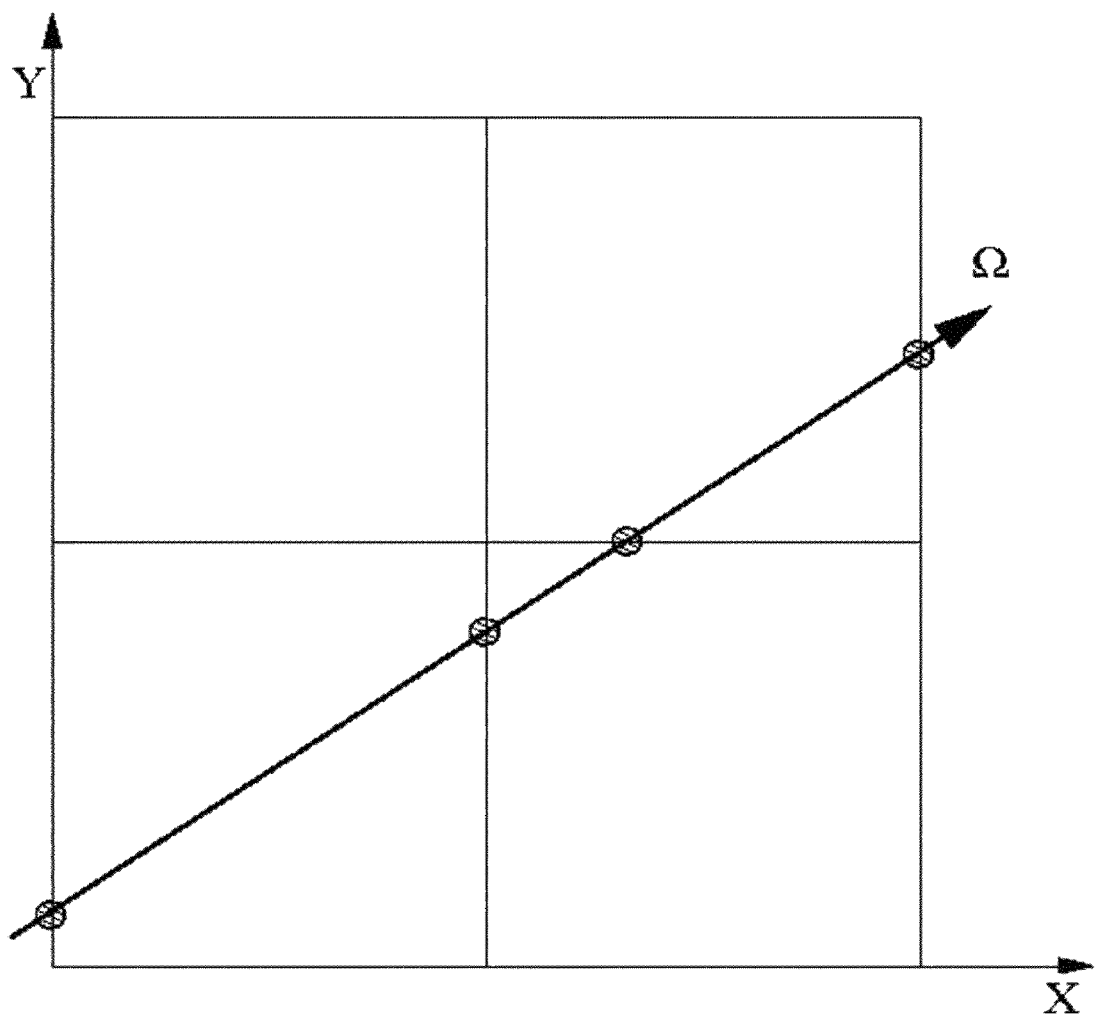
FIG. 8 is the ray tracing diagram on the Cartesian grid. It comprises the detection of a sequence of intersections with the orthogonal grid.

Ray tracing according to the voxel-based ray tracing method requires each transparent grid cell lying on the ray path to be visited, see FIG. 8. The processing of many empty (i.e. transparent) cells may take up a significant part of the computing time, particularly when the model has large, air-filled cavities or fine networking in the intermediate spaces. A method would accelerate ray tracing, so that a ray immediately "tunnels" over a larger block of empty cells rather than visiting each grid cell encountered on the way. Information on the size of empty cell blocks of this kind should be available for this.

Empty blocks of this kind may be explicitly defined in the grid. A better method is referred to as the so-called Chebyshev distance or also the chess board distance. This is a distance measurement for discrete objects such as grid cells which is measured in whole numbers.

Figure 10:
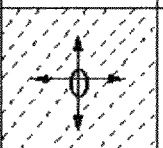
FIG. 10A is an illustration of the isotropic Chebyshev distance with the help of 2D examples.
FIG. 10B is an illustration of the anisotropic Chebyshev distance with the help of 2D examples.

An illustration of the Chebyshev distance with the help of 2D examples is shown in FIG. 10. The following procedure is used in this case.

The distance from the dotted grid cells (zero cells) is measured. FIG. 10A shows the isotropic classic Chebyshev distance. Cells at the same distance about the dotted zero cells at zero distance are arranged in a layer at the edge of a square. FIG. 10B shows the anisotropic Chebyshev distance for the upper left square. The anisotropic distance is correspondingly defined only for cells which lie in this square in relation to one of the zero cells. Otherwise, it is measured in exactly the same way as the isotropic distance in FIG. 10A. The directions observed (quadrant) are marked with red arrows in the zero cells in both cases. It is evident that the anisotropic distance achieves greater values than the isotropic.

Use of the Chebyshev distance allows steps involved in ray tracing to be adaptively configured, independently of the current distance from a surface. If the current position of the traced ray is far removed from the next surface, the jump in the grid will also be correspondingly large. When the ray approaches a surface, the Chebyshev distance diminishes and with it the jump size too. The closer a ray gets to the surface, the slower its progress.

The classic isotropic Chebyshev distance is measured in relation to the marked grid cells using the zero distance. Cells of this kind are referred to below as zero cells. Cells at the same Chebyshev distance from a chosen zero cell are arranged in quadratic layers about the zero cell.

The distance is obtained by looking for grid cells that have not yet been marked. When at the end of the first step of the algorithm all the following cells from the first layer with a distance equal to 1 are found and marked, the next layer is assigned distance 2. For this purpose, all unmarked cells with direct neighbours or over edge neighbours with distance 1 are searched for. A similar procedure is followed with the other layers until no further cells without an entered distance are found.

The work involved in a direct calculation of the Chebyshev distance behaves accordingly as $\sim N^{4/3}$, where N is the number of grid cells.

This correlation is not obligatory, however, and can be optimized when upon the assignment of each following layer of cells at distance (i+1) only the grid cells at distance i located earlier and temporarily stored are processed. Only their neighbour cells are examined. In this way, the front of the "active" cells last located is propagated. The method requires written access into the outer cells of the stencil to be possible, however. It therefore places limitations on parallelization through the decomposition of domains.

The procedure involved in calculating the anisotropic Chebyshev distance is very similar. A distance for a cell in the isotropic case is now replaced by $2^2=4$ distances in a 2D case and $2^3=8$ distances in a 3D case, however. Each of the 4 distances is only calculated for grid cells in the 3D case, which lies in the corresponding quadrant, viewed from zero cells; see FIG. 10B. The assignment of distances there is calculated for the quadrant between the Cartesian directions −X and +Y. In 3D a distinction is made between the 8 octants. In both cases, unlike in the case of the isotropic Chebyshev distance, there is no assignment of distances in the cells which do not have zero cells in the given quadrant (2D) or octant (3D), from which the distance is measured.

Determining an octant requires the use of the anisotropic distance in ray tracing. A check is initially made to see in which octant the ray direction $\vec{\Omega}$ lies. The 8 anisotropic distances are then used in the 3D case, which corresponds to an opposite octant. If, for example, a ray comes from the direction (0.5, 0.2, −0.1), it lies in the octant (+X, +Y, −Z). The corresponding distance starting from the zero cells was measured in an octant against the ray direction. The necessary distance is therefore stored in the octant (−X, −Y, +Z).

The advantage of an anisotropic distance over an isotropic one is a more precise specification for a possible jump over a block of empty cells in ray tracing. The value of the anisotropic distance in an octant often turns out to be greater than with isotropic, cf. FIGS. 10A and 10B. The probability that a zero cell lies in an octant cube of the grid is smaller than in the isotropic case, where the corresponding cube is made up of 8 such octants. The ray tracing can therefore make greater jumps in the grid.

One disadvantage of the anisotropic distance is the memory additionally required for this in the case of ray tracing, which amounts to an extra 96 bytes per grid cell in the "int" distance type. In order to save memory, distances with the "unsigned char" type are assigned in this method. This type permits a maximum distance size of 128 grid cells. Greater values may theoretically occur in an application. The assignment of distances during their calculation is therefore interrupted once the layer with value 128 has been reached and the remaining unassigned transparent cells with the same value of 128 are assigned. In this way, the maximum possible length of a jump in the grid is limited during ray tracing.

Opaque cells with defined radiation tiles and cells on the outer edge of the numerical grid in contact with a transparent cell are defined as zero cells in the method. Said method ensures that all transparent cells are completely surrounded by a layer of zero cells and there is at least one reference zero cell for each transparent cell in the anisotropic case too.

Figure 11:
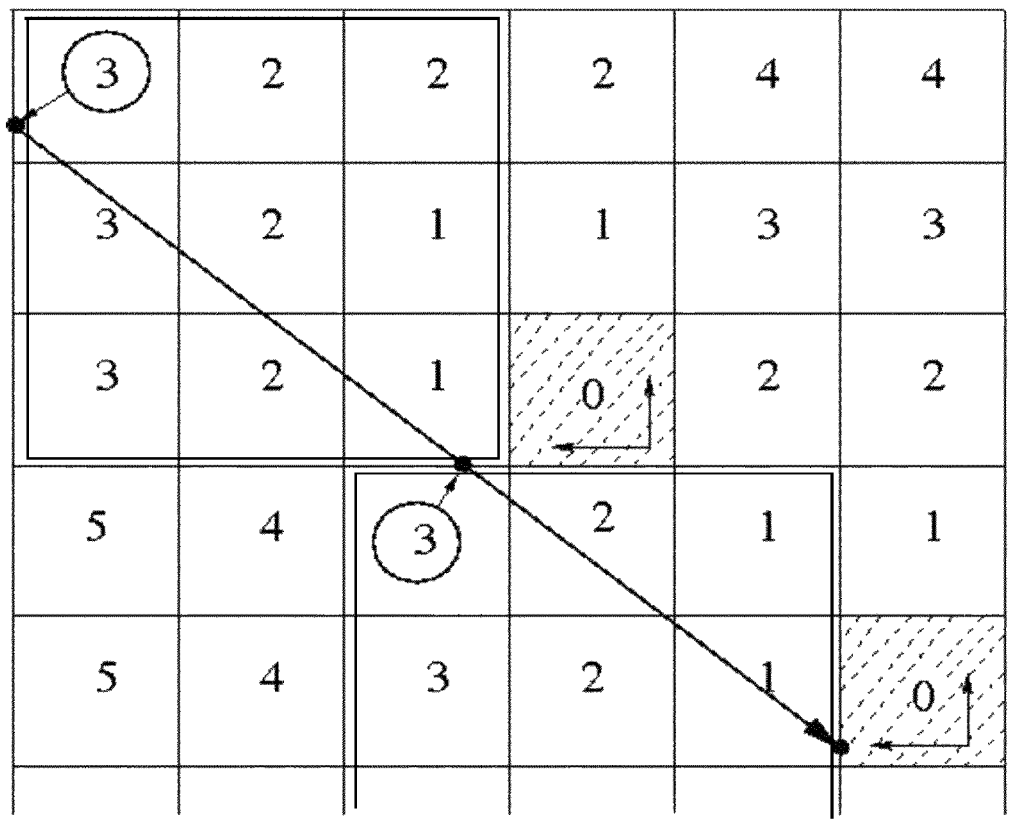
FIG. 11 is an example of ray tracing in 2D supported by anisotropic Chebyshev distance.
Figure 12:
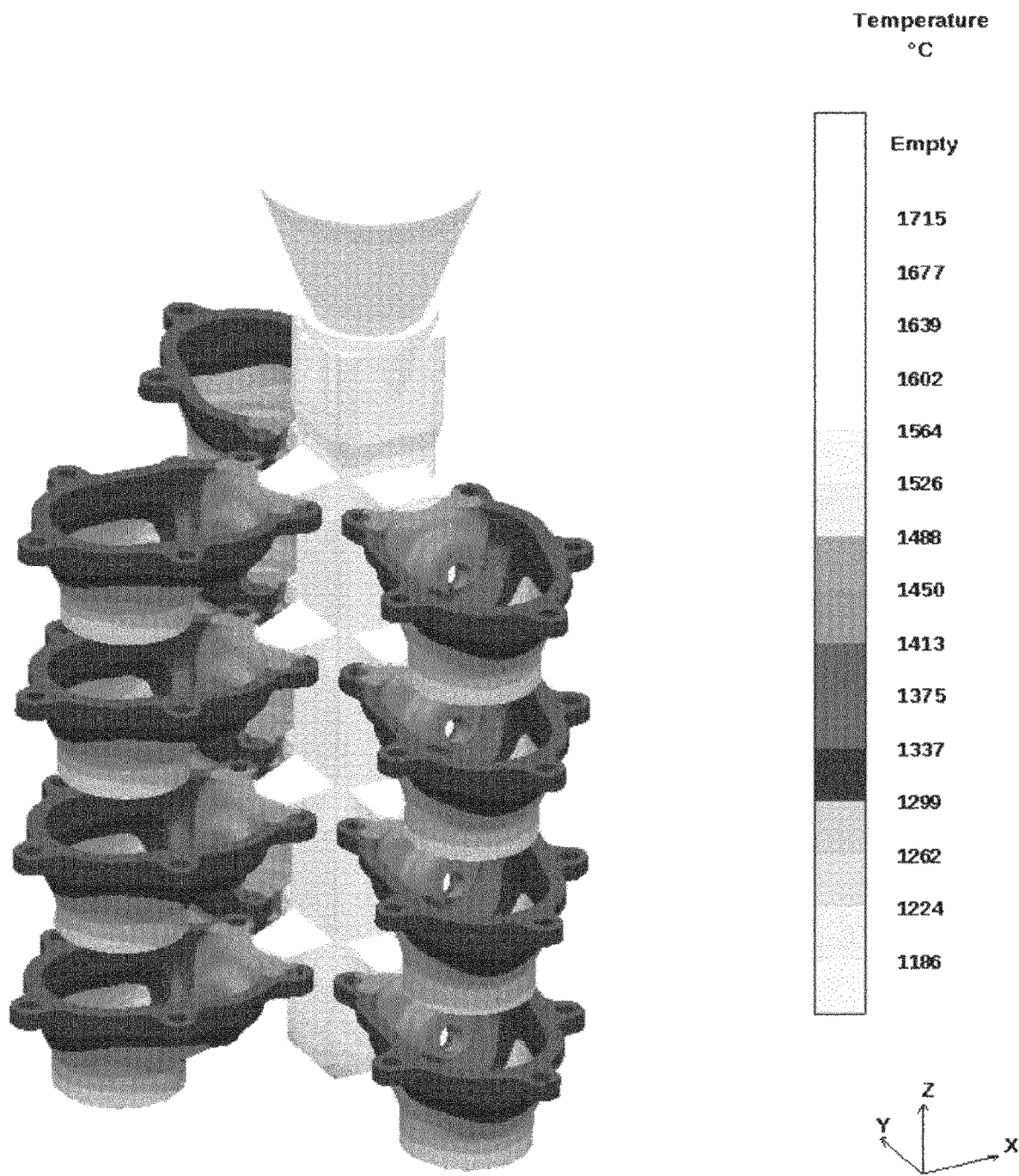
FIG. 12 is an example of a thermal result for an investment casting project calculated using the radiation model.
Figure 13:
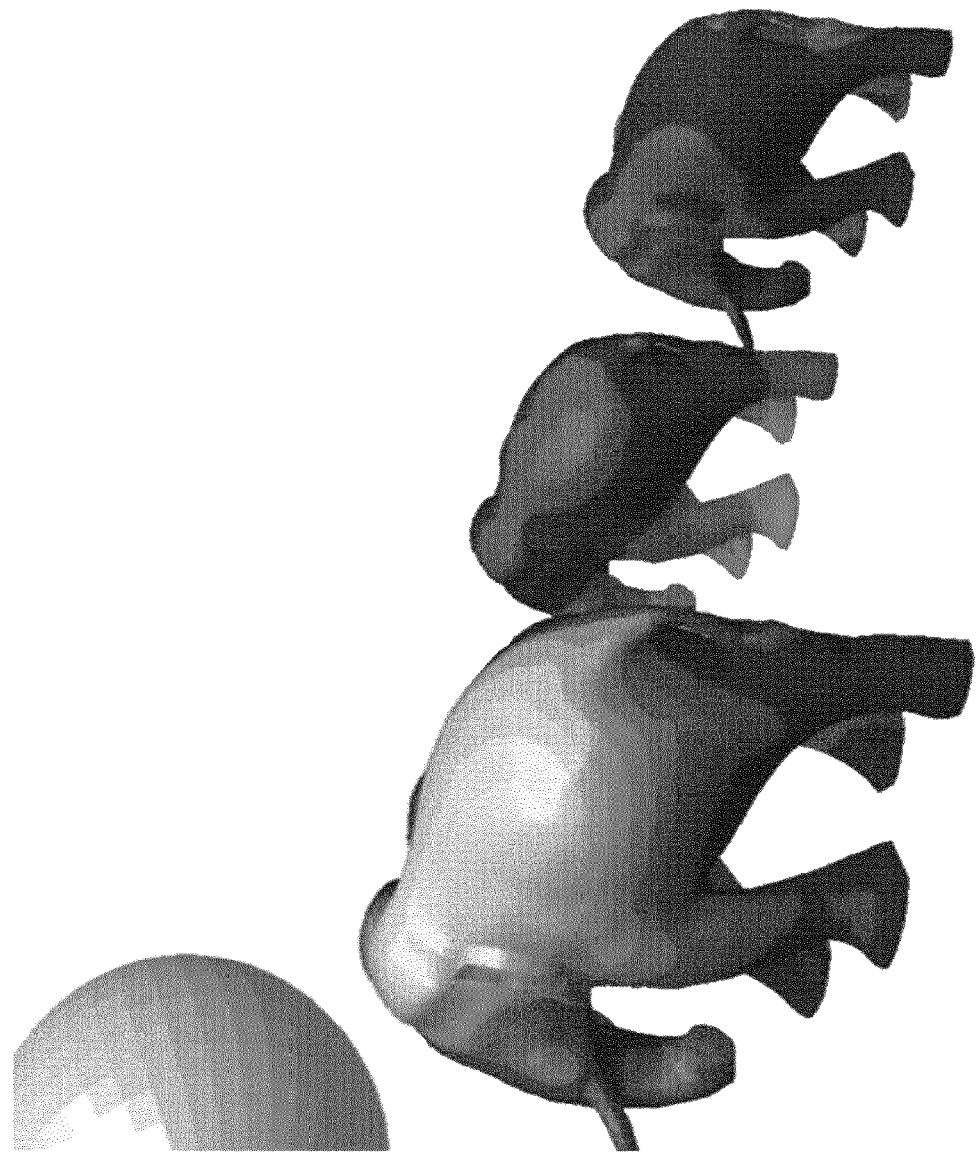
FIG. 13 shows the elephant family: a test of the model efficiency, effects of masking and distance from the heat source. The heat comes from the ball at the top left of the image.
Figure 14:
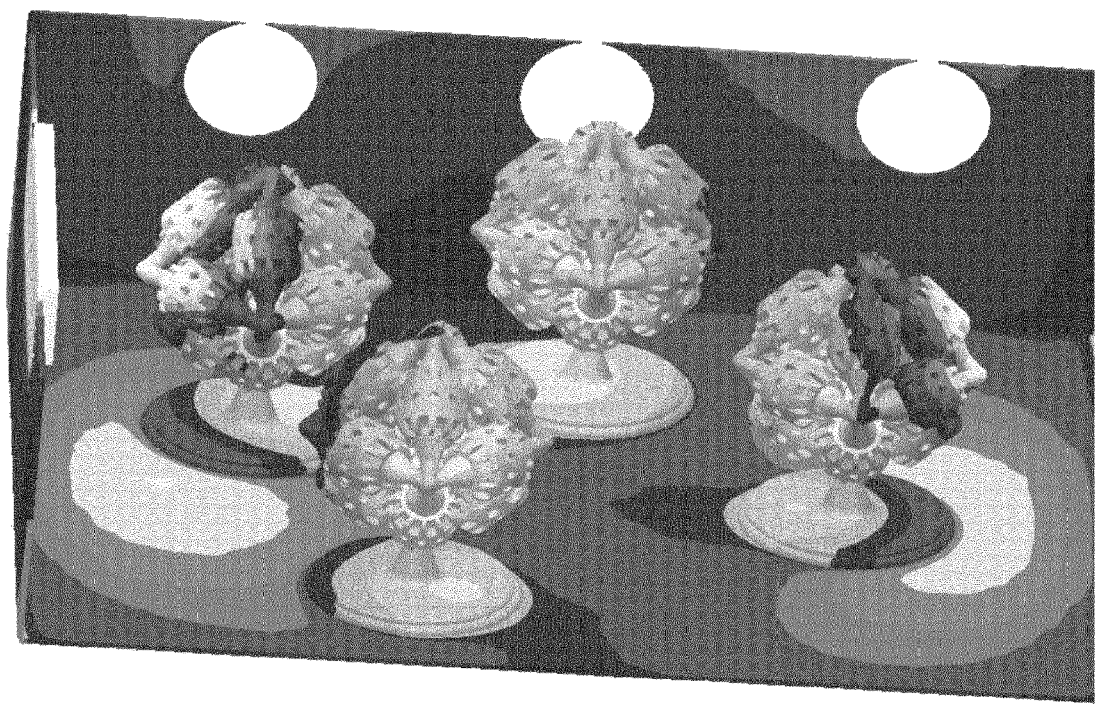
FIG. 14A shows a modelling of the simultaneous heat treatment of 4 gearwheel assemblies in a furnace with semi-closed cavity. The entire model is shown. The heat sources are mounted on the left and right walls.
FIG. 14B shows a modelling of the simultaneous heat treatment of 4 gearwheel assemblies in a furnace with semi-closed cavity. Tempered assemblies are shown. The heat sources are mounted on the left and right walls.
Figure 14:
Figure 15:
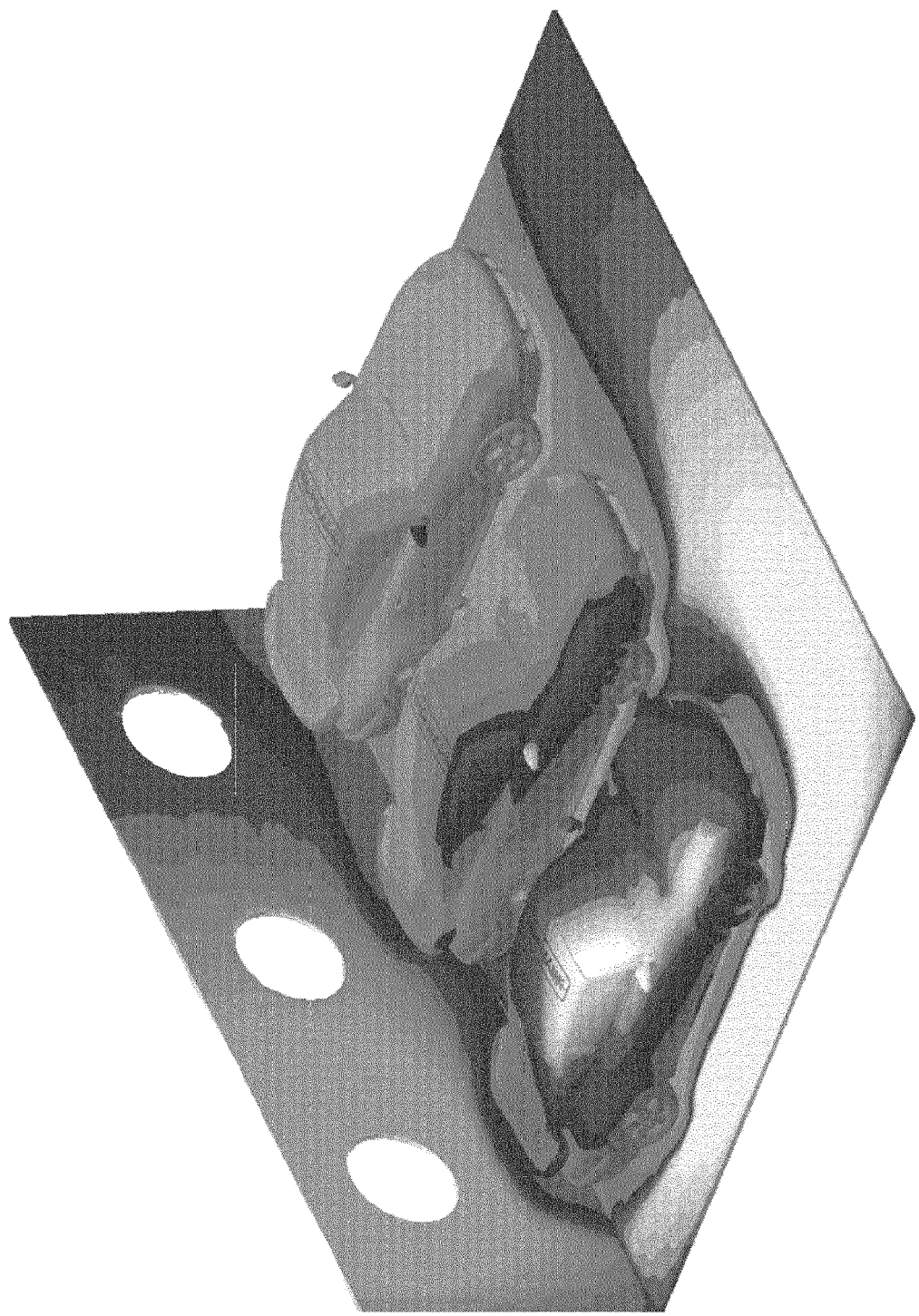
FIG. 15 shows calculated scenarios with three cars. The heat source is at the front top, not shown in the image.
Figure 16:
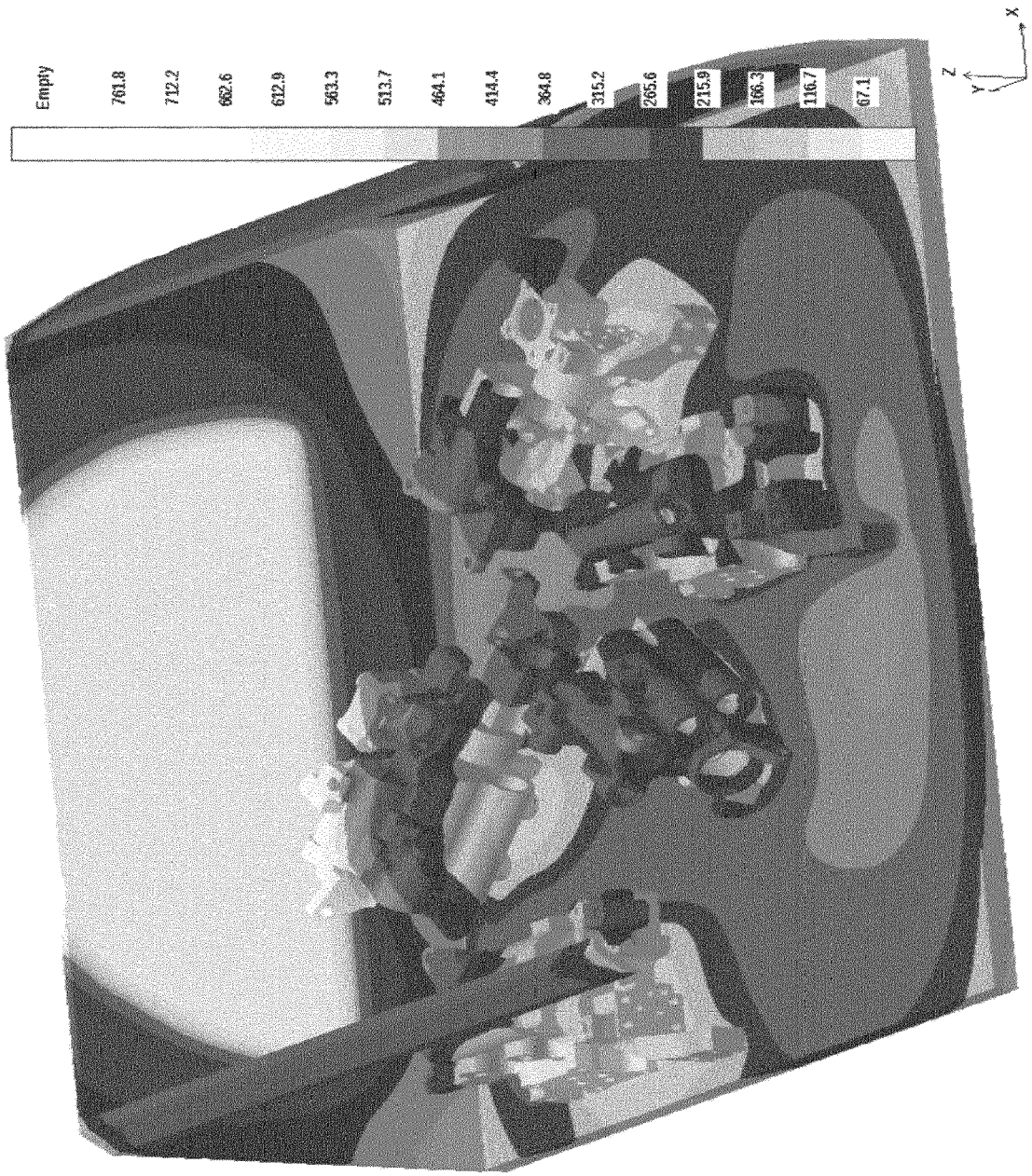
FIG. 16 shows heat treatment of 5 cast pump houses in a furnace.

An example of ray tracing in 2D, supported by anisotropic Chebyshev distance, is shown in FIG. 11. The grid and the calculated distance are taken from FIG. 10 on the right. The ray in the octant (+X, −Y) is processed with distance in the octant (−X, +Y). The initial position of the ray in the intersection with a cell side at top left lies in the cell at distance 3. The next intersection with the side of the 3×3 cube is therefore searched for. Following displacement of the position to the intersection, the Chebyshev distance is taken from the next cell in the direction of the ray path. It is once again equal to 3 and the next jump leads the ray right to the target at bottom right. In this example, 2 intersections were searched for; without using the Chebyshev distance the total would be 9.

The additional costs involved in ray tracing with Chebyshev distance are in the determination of the discrete position of the ray following the jump over a block of grid cells. The coordinates of the intersection can be similarly calculated according to the equations (9). The Cartesian coordinates on the edge of the grid cell $X_L$ are replaced, however, by the coordinates on the edge of the octant cube, which is equal to the coordinates of a grid cell further away.

The indices of the cell found after the jump in 3 Cartesian directions are unknown. They are determined according to the binary search algorithm. The index in the grid at the intersection is estimated in each direction starting from an equidistant grid in the cube. By comparing coordinates a check is then made to see whether the intersection located lies in the cell with the estimated index. If not, the corresponding half of the interval with the Chebyshev distance length is further halved. The procedure is repeated recursively in this manner until the located index of the cell belongs to the intersection. The work involved in the binary search in a fixed interval depends logarithmically on the length of the interval, i.e. for a maximum jump length of 128 cells, ~ln(128)=8 ln(2)~5 comparative operations would be required per direction.

Despite the additional work involved for a grid jump, the Chebyshev distance provides a substantial acceleration of the method, particularly for models in which a large amount of space has transparent material assigned to it.

Parallel Ray Tracing

Load Distribution in the Case of Ray Tracing:

Good scalability in parallel operation is the important prerequisite for efficiency with initialization of the model (Chebyshev distance, ray tracing) and its application in thermal calculation. The calculation time for ray tracing is decisive in this case.

The customary practice for parallelization with a distributed memory like MPI, when solving partial differential equations, is to decompose the computation domain. Its use for ray tracing has demonstrated poor scalability in this development, however. The reason for this is high communication costs. Data for the millions of rays must be transferred repeatedly between the individual partitions. The specific weight of the communication grows as the number of CPU's increases, which ultimately leads to poor scalability. Another method of parallelization is therefore developed in this model.

Ray tracing and calculation of the Chebyshev distance are performed simultaneously on each CPU for the entire grid. However, the radiation tiles are still locally defined on each CPU in this case.

The global grid model is created in the first section. The grid data of the entire grid are communicated to all CPU's. On the one hand, three rows of coordinates are communicated in three Cartesian directions. On the other hand, a flag is determined from root for the transparency of each grid cell and communicated in a numerical field of the "unsigned char" type to all CPU's. These data are sufficient to carry out the implementation of ray tracing on the tensor product grid independently of one another on each CPU. The symmetrical limits in the thermal model are also taken into account at this point.

The data determined locally by ray tracing via the radiation sources of the radiation tiles should, however, finally reach the CPU, where the corresponding file is locally defined. Communication costs are generated at this point. In order to minimize them, the following procedure is used.

1. The number of locally defined radiation tiles N existing on a CPU is determined.
2. The arithmetic mean $N_{av}$ is then calculated across the CPU's.
3. From a CPU-donator with an excess of tiles $N_1 > N_{av}$ a portion $\Delta N$ of tiles is virtually removed from the donator and assigned to the CPU acceptor next located with $N_2 < N_{av}$, such that after this operation either the condition $N_1 = N_{av}$ or $N_2 = N_{av}$ is satisfied. The transferred portion in this case is equal to $N = \text{MIN}(N_1 - N_{av}, N_2 - N_{av})$. The indices of the tiles to be transferred and the ID's of the CPU acceptors are stored each time.

4. Step 3 is repeated until it is no longer possible to balance the tiles between the CPU's.

Once the parameters for the balancing of loads as described above are known to each CPU, local data on the position of the radiation tiles in the grid are communicated by the CPU donators to the CPU acceptors. The CPU acceptors in this way receive a list of imported tiles to be processed, in addition to the list of their own tiles. The lists of own tiles to be processed on the CPU donators are correspondingly shortened.

Parallel Ray Tracing:
1. Prior to ray tracing, calculation of the anisotropic Chebyshev distance takes place on each CPU independently of one another. No communication is necessary in this case; calculations and results on each CPU are identical at this point. The work required for this calculation takes a few seconds, so that the organisation of a division of work between the individual CPU's and subsequent communication would barely be worthwhile in this case.
2. During ray tracing, all rays on each CPU are despatched independently of one another starting from the own tiles to be processed first, radiation sources are located and the identified sources are stored following their geometric and thermal adaptation. Storage of the radiation sources takes place in this step directly in the data structure of own radiation tiles.
3. Once all own tiles have been processed, it is the turn of the imported tiles on the CPU acceptors. The same ray tracing procedure and determination of the ray sources is used when processing these tiles. The radiation sources located and compressed by the adaptation procedure are temporarily stored in a buffer.
4. When all tiles have been processed, the results are communicated. The CPU acceptors transmit the located radiation sources of the imported tiles back to the CPU donators. MPI communication takes place asynchronously, wherein with an irregular distribution of tiles each donator may have several acceptors and each acceptor may have several donators. The radiation sources received by the donator are written into the data structure of the own tiles in this step straight after receipt from a CPU acceptor.
5. At the end of ray tracing, data that is no longer needed, such as Chebyshev distances and buffer stores for communication, are deleted.

Thermal Calculation

In order to solve the summation of the outgoing heat fluxes in line with the multi-level method according to equation (8), a suitable algorithm is used for the solution by approximation of linear equation systems. The summation is exemplified below using the Gauss-Seidel iterative method, although it could also be solved by means of other algorithms, for example the Jacobi method or the SOR method.

In one embodiment, the Gauss-Seidel iterative method is used to calculate the absorbed heat flux on each radiation tile. This flux represents the final result for the thermal model from the radiation side. Knowledge of the outgoing heat fluxes is necessary across all CPU's at this point, as the path of rays taken into account have been calculated for each ray without taking account of the domain decomposition.

It is advantageous for the Gauss Seidel iterative method to take place on each CPU only for local radiation tiles. The summation of the outgoing heat fluxes in line with the multi-level method according to equation (8) contains contributions from all tiles determined by ray tracing, including from other CPU's.

In this way, the outgoing heat fluxes in the algorithm can be made globally visible. Each radiation tile is assigned a continuous, global index, wherein the same indices can be advantageously stored instead of the radiation sources for each tile during ray tracing.

The global outgoing heat fluxes may be indicated in an array according to the global index, wherein before each passage of the Gauss-Seidel loop, the outgoing flows from all local tiles are communicated into the global array.

Potential Areas of Application, Examples

The model of thermally coupled surface radiation for diffuse grey radiators introduced above may find an application in many technical processes where cavities or semi-transparent materials and high temperatures exist. The attractive aspect of the method lies in its ease and very short calculation time, within which the most rigorous problems in the modelling of the remote action of thermal radiation are processed.

The most interesting applications in simulating casting processes are investment casting, heat treatment and block casting with plant configurations assembled in series.

Further applications are associated with the production and operation of industrial furnaces, for example in the case of glass production or ceramic production, in chemistry, crystal growing, metallurgy, or also in the food industry, e.g. ovens.

Various examples of the application of the method are shown in FIGS. 12 to 16. As shown, the method here is not limited to only one heat source, but a plurality, e.g. two (FIG. 14) and a higher number of heat sources can also be used.

The method indicated here for the discretization of a solid angle for use in a simulation process can be conceived of in its application not only in connection with thermally coupled surface radiation, but can also be used in other calculation and simulation processes where acceleration and savings in computer time and computer memory used, such as rendering software, for example, in general and computer games in particular or scientific rendering tools is of importance.

The method of ray tracing indicated here for use in a simulation process can be conceived of similarly in its application not only in connection with thermally coupled surface radiation, but can also be used in other calculation and simulation processes where acceleration and savings in computer time and computer memory used, such as rendering software, for example, in general and computer games in particular or scientific rendering tools is of importance. In particular, the unconventional method of parallel computing proposed here to accelerate a ray tracing calculation alone and in combination with anisotropic Chebyshev distance calculations and/or additional acceleration through tile clustering is not known to the inventor from the prior art.

The invention claimed is:

1. A method implemented on a computer comprising at least a non-transitory computer-readable medium and a plurality of CPUs for achieving acceleration and savings in terms of computer time and computer memory when simulating a casting process of a solid body having at least one surface being exposed to radiation, the method comprising executing on at least one of said plurality of CPUs the steps of:
calculating a radiative exchange between grey, diffuse surfaces of said solid body, by
subdividing surfaces exposed to radiation adaptively and hierarchically into a plurality of radiation tiles of the same or virtually the same radiation intensity, creating, on the computer-readable medium, a global grid model comprising grid data, said grid data comprising information on said plurality of radiation tiles, communicating said grid data of said global grid model to each of the plurality of CPUs, and calculating surface temperature as a total of all partial amounts of the plurality of radiation tiles by evaluating a solid angle integral for each radiation tile using a plurality of refinement levels comprising at least a first refinement level, wherein the solid angle, which is centered at the mid-point of a radiation tile and with the center of the solid angle coinciding with the normal direction of a radiation tile, is subdivided into a plurality N of primary subdivisions in such a manner that each primary subdivision corresponds to the same view factor $VF=1/N$, a second refinement level, wherein each primary subdivision is further subdivided hierarchically into a plurality of secondary subdivisions, a third refinement level, wherein each secondary subdivision is further subdivided hierarchically into a plurality of tertiary subdivisions, wherein each solid angle subdivision is discretized into its partial areas by spherical projection onto a hemisphere describing the solid angle, placed about the centre of said radiation tile, and projecting each resulting subdivisions from all refinement levels to the surrounding global grid, and determining a total of all partial amounts of that solid angle integral by means of ray tracing, wherein the directions of individual rays for each solid angle subdivision are defined by the vector from the middle of the radiation tile to the center of the solid angle subdivision and wherein rays are sent out from all refinement levels in a succession, and wherein the ray tracing is accelerated by means of parallel computing, wherein the plurality of CPUs are programmed in a manner that before the ray tracing, a number of locally defined radiation tiles are determined on each CPU and said plurality of radiation tiles are balanced between said plurality of CPUs by calculating an arithmetic mean of said plurality of radiation tiles to be processed by each CPU, thereby creating for each CPU a list of own radiation tiles to be processed comprising said locally defined radiation tiles and a list of imported radiation tiles to be processed based on the difference between said number of locally defined radiation tiles and said arithmetic mean, the ray tracing is performed simultaneously on each CPU adaptively and independently of one another starting with radiation tiles on the list of own radiation tiles and proceeding to radiation tiles on the list of imported radiation tiles by adapting the solid angle resolution based on homogeneity of radiation sources, starting from the finest refinement level and proceeding recursively towards the coarsest refinement level, and after ray tracing all computed radiation tile data of the imported radiation tiles is communicated to the CPU where a corresponding radiation tile is locally defined.

2. The method according to claim 1, wherein the ray tracing is additionally accelerated by radiation tile clustering.

3. The method according to claim 1, wherein the ray tracing is additionally accelerated by an anisotropic Chebyshev distance method.

4. The method according to claim 1, wherein the method for simulating in a casting process the influence of thermally coupled surface radiation on a solid body having at least one surface being exposed to radiation further comprises providing, on the computer-readable medium, a 3D model of said solid body, embedding, using at least one of the plurality of CPUs, said 3D model of said solid body in a 3D grid, and locating, using at least one of the plurality of CPUs, the individual radiant surfaces in the 3D grid.

5. A non-transitory computer-readable medium, with instructions stored thereon, that when executed by at least one CPU of a computer comprising at least a plurality of CPUs, implements a method for simulating in a casting process the influence of thermally coupled surface radiation on a solid body having at least one surface capable of being exposed to radiation, the method comprising calculating a radiative exchange between grey, diffuse surfaces of said solid body by subdividing surfaces to be exposed to radiation adaptively and hierarchically into a plurality of radiation tiles of the same or virtually the same radiation intensity, creating, on the computer-readable medium, a global grid model comprising grid data, said grid data comprising information on said plurality of radiation tiles, communicating said grid data of said global grid model to each of the plurality of CPUs, and calculating surface temperature as a total of all partial amounts of the plurality of radiation tiles by evaluating a solid angle integral for each radiation tile using a plurality of refinement levels comprising at least a first refinement level, wherein the solid angle, which is centered at the mid-point of a radiation tile and with the center of the solid angle coinciding with the normal direction of a radiation tile, is subdivided into a plurality N of primary subdivisions in such a manner that each primary subdivision corresponds to the same view factor $VF=1/N$, a second refinement level, wherein each primary subdivision is further subdivided hierarchically into a plurality of secondary subdivisions, a third refinement level, wherein each secondary subdivision is further subdivided hierarchically into a plurality of tertiary subdivisions, wherein each solid angle subdivision is discretized into its partial areas by spherical projection onto a hemisphere describing the solid angle, placed about the centre of said radiation tile, and projecting each resulting subdivisions from all refinement levels to the surrounding global grid, and determining a total of all partial amounts of that solid angle integral by means of ray tracing, wherein the directions of individual rays for each solid angle subdivision are defined by the vector from the middle of the radiation tile to the center of the solid angle subdivision and wherein rays are sent out from all refinement levels in a succession, and wherein the computer-readable medium comprises instructions for accelerating the ray tracing by means of parallel computing on the plurality of CPUs, whereby before the ray tracing, a number of locally defined radiation tiles are determined on each CPU and said plurality of radiation tiles are balanced between said plurality of CPUs by calculating an arithmetic mean of said plurality of radiation tiles to be processed by each CPU, thereby creating for each CPU a list of own radiation tiles to be processed comprising said locally defined radiation tiles and a list of imported radiation tiles to be processed based on the difference between said number of locally defined radiation tiles and said arithmetic mean, wherein the ray tracing is performed simultaneously on each CPU adaptively and independently of one another starting with radiation tiles on said list of own radiation tiles and proceeding to radiation tiles on the list of imported radiation tiles to be processed by adapting the solid angle resolution based on homogeneity of radiation sources, starting from the finest refinement level and proceeding recursively towards a coarsest refinement level, and wherein after ray tracing all computed radiation tile data of the imported radiation tiles is communicated to the CPU where a corresponding radiation tile is locally defined.

6. The non-transitory computer-readable medium according to claim 5, wherein the ray tracing is additionally accelerated by radiation tile clustering.

7. The non-transitory computer-readable medium according to claim 5, wherein the ray tracing is additionally accelerated by an anisotropic Chebyshev distance method.

8. The non-transitory computer-readable medium according to claim 5, wherein the method for simulating in a casting process the influence of thermally coupled surface radiation on a solid body having at least one surface being exposed to radiation further comprises providing, on the computer-readable medium, a 3D model of said solid body, embedding, using at least one of the plurality of CPUs, said 3D model of said solid body in a 3D grid, and locating, using at least one of the plurality of CPUs, the individual radiant surfaces in the 3D grid.

* * * * *